(12) United States Patent
Zheng et al.

(10) Patent No.: US 10,265,764 B2
(45) Date of Patent: *Apr. 23, 2019

(54) CASTING METHOD AND CAST ARTICLE

(71) Applicant: GENERAL ELECTRIC COMPANY, Schenectady, NY (US)

(72) Inventors: Jian Zheng, Simpsonville, SC (US); Arthur S. Peck, Greenville, SC (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 277 days.

This patent is subject to a terminal disclaimer.

(21) Appl. No.: 15/383,384

(22) Filed: Dec. 19, 2016

(65) Prior Publication Data

US 2017/0095857 A1  Apr. 6, 2017

Related U.S. Application Data

(63) Continuation-in-part of application No. 14/165,719, filed on Jan. 28, 2014, now Pat. No. 9,555,471.

(51) Int. Cl.
*F01D 5/14* (2006.01)
*B22D 21/00* (2006.01)
(Continued)

(52) U.S. Cl.
CPC ......... *B22D 27/045* (2013.01); *B22D 21/005* (2013.01); *B22D 25/02* (2013.01);
(Continued)

(58) Field of Classification Search
CPC ...... B22D 27/045; B22D 25/06; B22D 25/02; B22D 21/005; C30B 13/00; C30B 29/52;
(Continued)

(56) References Cited

U.S. PATENT DOCUMENTS 8,870,999 B2   10/2014  Wang et al.
9,555,471 B2 *  1/2017  Zheng .................. B22D 27/045
(Continued)

FOREIGN PATENT DOCUMENTS

EP    0477136 A1   3/1992
EP    1 076 118 A1   2/2001
(Continued)

OTHER PUBLICATIONS

European Search Report and Written Opinion issued in connection with corresponding EP Application No. 15152436.0-1362 dated Aug. 17, 2015.
(Continued)

*Primary Examiner* — Keith Walker
*Assistant Examiner* — John A Hevey
(74) *Attorney, Agent, or Firm* — McNees Wallace & Nurick LLC

(57) ABSTRACT

A casting method and cast article are provided. The casting method includes providing a casting furnace, the casting furnace including a withdrawal region in a lower end, positioning a mold within the casting furnace, positioning a molten material in the mold, partially withdrawing the mold a withdrawal distance through the withdrawal region in the casting furnace, the withdrawal distance providing a partially withdrawn portion, then reinserting at least a portion of the partially withdrawn portion into the casting furnace through the withdrawal region, and then completely withdrawing the mold from the casting furnace. The reinserting at least partially re-melts a solidified portion within the partially withdrawn portion to reduce or eliminate freckle grains. The cast article includes a microstructure and occurrence of freckle grains corresponding to being formed by a process comprising partially withdrawing, reinserting, and
(Continued)

completely withdrawing of a mold from a casting furnace to form the cast article.

17 Claims, 4 Drawing Sheets

(51) Int. Cl.
    *B22D 25/02*      (2006.01)
    *B22D 25/06*      (2006.01)
    *B22D 27/04*      (2006.01)
    *C30B 13/00*      (2006.01)
    *C22C 19/05*      (2006.01)
    *C30B 29/52*      (2006.01)

(52) U.S. Cl.
    CPC ............ *B22D 25/06* (2013.01); *C22C 19/057* (2013.01); *C30B 13/00* (2013.01); *C30B 29/52* (2013.01); *F01D 5/147* (2013.01); *F05D 2220/30* (2013.01); *F05D 2230/21* (2013.01); *F05D 2240/307* (2013.01)

(58) Field of Classification Search
    CPC . F01D 5/147; C22C 19/057; F05D 2240/307; F05D 2230/21; F05D 2220/30
    See application file for complete search history.

(56) References Cited

U.S. PATENT DOCUMENTS

| | | |
|---|---|---|
| 2005/0067065 A1 | 3/2005 | Fernihough et al. |
| 2009/0165989 A1 | 7/2009 | Ebisu |
| 2010/0034692 A1 | 2/2010 | Feng |
| 2013/0022803 A1 | 1/2013 | Schaeffer et al. |
| 2014/0127032 A1 | 5/2014 | Naik |

FOREIGN PATENT DOCUMENTS

| | | |
|---|---|---|
| EP | 2 902 135 A2 | 8/2015 |
| GB | 1087026 | 10/1967 |
| GB | 2293629 A | 4/1996 |
| JP | 5528378 A | 2/1980 |
| WO | 2015/130371 A2 | 9/2015 |

OTHER PUBLICATIONS

Extended European Search Report and Opinion issued in connection with corresponding EP Application No. 17205764.8 dated Mar. 22, 2018.

* cited by examiner

CASTING METHOD AND CAST ARTICLE

CROSS REFERENCE TO RELATED APPLICATIONS

This application relates to and claims the benefit of U.S. patent application Ser. No. 14/165,719, filed Jan. 28, 2014, entitled "Casting Method and Cast Article," now U.S. Pat. No. 9,555,471, as a continuation-in-part thereof, the disclosures of which are incorporated by reference in its entirety.

FIELD OF THE INVENTION

The present invention is directed to a casting method and cast article. More specifically, the present invention is directed to a casting method for reducing or eliminating freckle grains and a cast article formed therefrom.

BACKGROUND OF THE INVENTION

Various components, such as turbine buckets for gas turbine engines, are often formed by directional solidification (DS)/single crystal (SC) casting techniques. More specifically, many components are often formed by a casting "withdrawal" technique where a melt-filled investment mold is withdrawn from a casting furnace. Withdrawing the melt-filled investment mold from the casting furnace permits a molten metal or alloy in the mold to cool and solidify, forming the component within the mold.

As the molten metal or alloy cools a thermal gradient across the solid/liquid interface which is too low, or an incline of the interface compared to the horizontal which is too high, may lead to the formation of freckle grains. Freckle grains are formed due to interdendritic fluid flow, which may result in equiaxed phases surrounded by eutectic phases. Freckle grains are considered undesirable features and may have unacceptable weakness, particularly in the form of reduced fatigue strength.

BRIEF DESCRIPTION OF THE INVENTION

In one exemplary embodiment, a casting method including providing a casting furnace, the casting furnace comprising a withdrawal region in a lower end, positioning a mold within the casting furnace, positioning a molten material in the mold, partially withdrawing the mold a withdrawal distance through the withdrawal region in the casting furnace, the withdrawal distance providing a partially withdrawn portion, at least partially solidifying the partially withdrawn portion, then reinserting at least a portion of the partially withdrawn portion into the casting furnace through the withdrawal region, at least partially re-melting the partially withdrawn portion, and then completely withdrawing the mold from the casting furnace through the withdrawal region to produce a directionally solidified or single crystal cast article. The at least partially re-melting the partially withdrawn portion reduces or eliminates freckle grains from the partially withdrawn portion.

In another exemplary embodiment, a casting method includes providing a casting furnace, the casting furnace comprising a withdrawal region in a lower end, positioning a mold within the casting furnace, positioning a molten material in the mold, partially withdrawing the mold through the withdrawal region in the casting furnace for a withdrawal time to provide a partially withdrawn portion, at least partially solidifying the partially withdrawn portion, reinserting at least a portion of the partially withdrawn portion into the casting furnace through the withdrawal region, at least partially re-melting the partially withdrawn portion, and then completely withdrawing the mold from the casting furnace through the withdrawal region to produce a directionally solidified or single crystal cast article. The at least partially re-melting the partially withdrawn portion reduces or eliminates freckle grains from the partially withdrawn portion.

In another exemplary embodiment, a directionally solidified or single crystal cast article includes a directionally solidified or single crystal microstructure and an occurrence of freckle grains corresponding to being formed by a process comprising partially withdrawing to solidify a portion of a withdrawn portion, reinserting to at least partially re-melt the withdrawn portion, and completely withdrawing a mold from a casting furnace to form the directionally solidified or single crystal cast article.

Other features and advantages of the present invention will be apparent from the following more detailed description of the preferred embodiment, taken in conjunction with the accompanying drawings which illustrate, by way of example, the principles of the invention.

BRIEF DESCRIPTION OF THE DRAWINGS

Wherever possible, the same reference numbers will be used throughout the drawings to represent the same parts.

DETAILED DESCRIPTION OF THE INVENTION

Provided are a casting method and a cast article. Embodiments of the present disclosure, in comparison to casting methods and cast articles not using one or more of the features disclosed herein, decrease or eliminate freckle grains in cast articles, increase efficiency of casting article, decrease casting costs, or a combination thereof.

Figure 1:
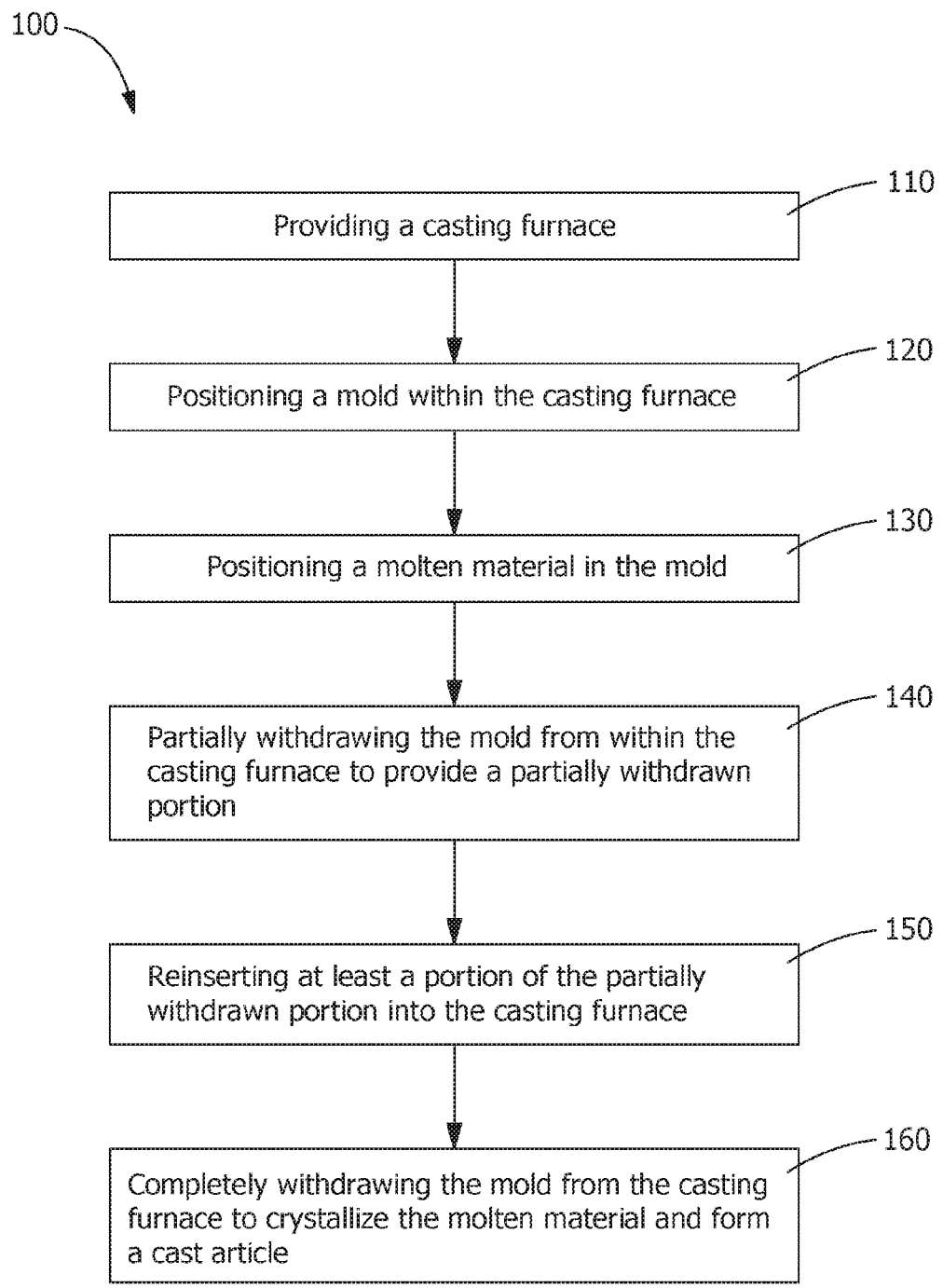
FIG. 1 is a flow chart of a casting method according to an embodiment of the disclosure.
Figure 2:
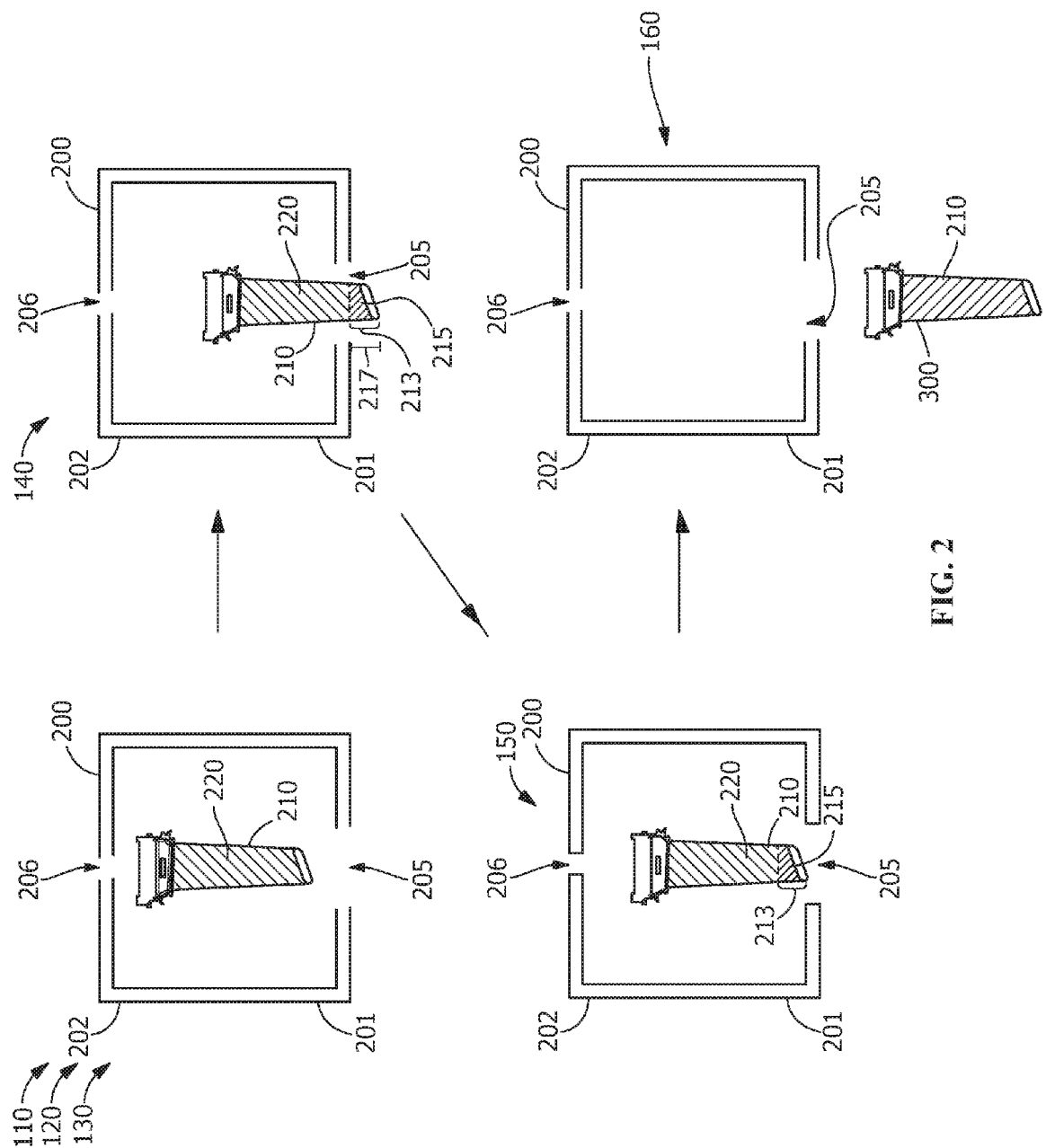
FIG. 2 shows a process view of a casting method according to an embodiment of the disclosure.
Figure 3:
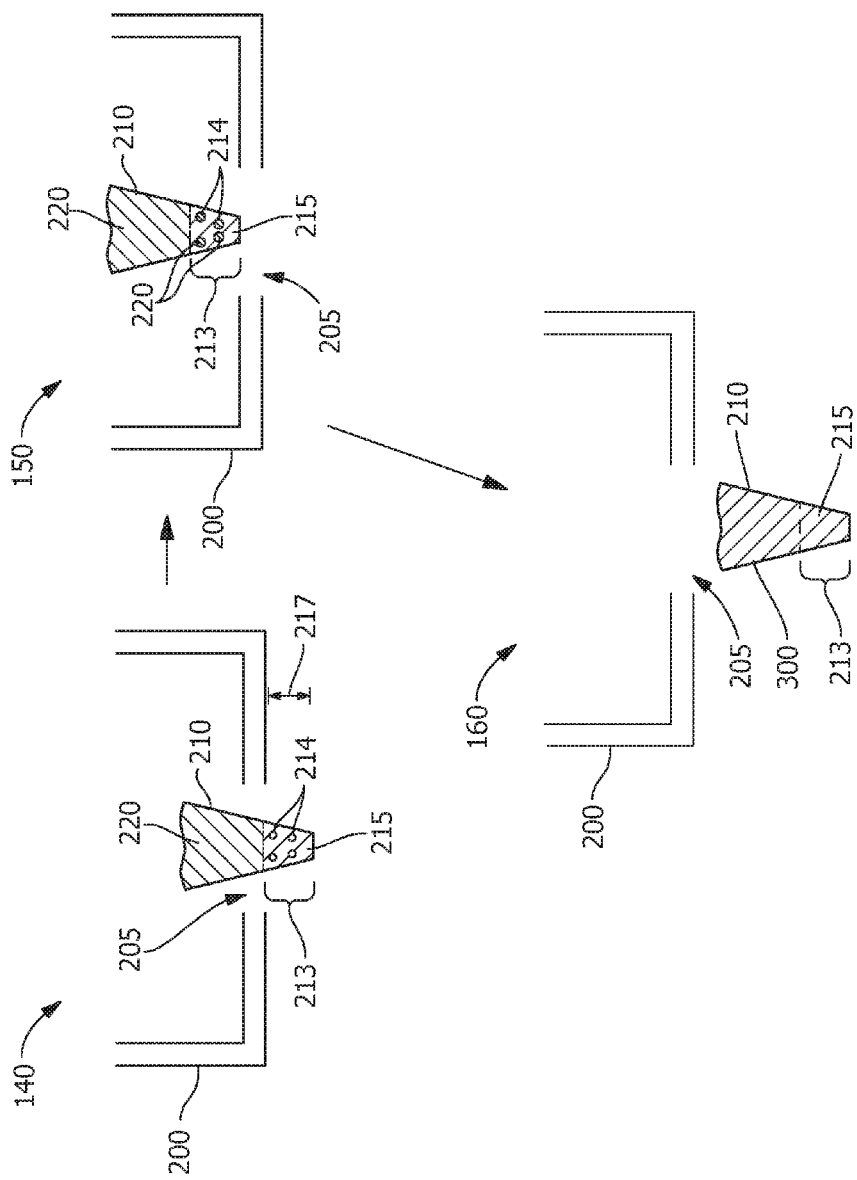
FIG. 3 shows an enhanced view of a casting method according to an embodiment of the disclosure.

Referring to FIGS. 1-3, a casting method 100 includes providing a casting furnace 200 (step 110), positioning a mold 210 within the casting furnace 200 (step 120), and positioning a molten material 220 in the mold 210 (step 130). Next, partially withdrawing (step 140) the mold 210 including the molten material 220 a withdrawal distance 217 through a withdrawal region 205, for example, according to one embodiment, in a lower end 201 of the casting furnace 200, provides a partially withdrawn portion 213. The molten material 220 in the partially withdrawn portion 213 at least partially solidifies to form a solidified portion 215.

After the partially withdrawing (step 140), in one embodiment, the casting method 100 includes holding the mold 210 at the withdrawal distance 217 for a partial withdrawal hold time, then reinserting (step 150) at least a portion of the partially withdrawn portion 213 into the casting furnace 200 through the withdrawal region 205 to form a reinserted portion. The partial withdrawal hold time includes any suitable duration, such as, but not limited to, up to about 5 minutes, between about 15 seconds and about 5 minutes, between about 30 seconds and about 5 minutes, or any combination, sub-combination, range, or sub-range thereof. The reinserting (step 150) at least partially re-melts the solidified portion 215 to reduce or eliminate freckle grains 214 (see FIG. 3), for example, formed in the solidified portion 215 during the partially withdrawing (step 140). The reinserting (step 150) is followed by holding the reinserted portion within the casting furnace 200 for a reinsertion hold time, then completely withdrawing (step 160) the mold 210 from the casting furnace 200 to crystallize the molten material 220 and form a cast article 300. The reinsertion hold time includes any suitable duration, such as, but not limited to, up to about 5 minutes, between about 15 seconds and about 5 minutes, between about 30 seconds and about 5 minutes, or any combination, sub-combination, range, or sub-range thereof. The partial withdrawal hold time and the reinsertion hold time are the same, similar, substantially similar, or different.

Referring to FIGS. 2-3, the casting furnace 200 includes any suitable casting furnace for receiving the mold 210 (see FIG. 2), and maintaining a temperature of the molten material 220 (see FIG. 3) at or above a molten material crystallization temperature. One suitable casting furnace includes, but is not limited to, a directional solidification casting furnace. In one embodiment, the casting furnace 200 receives and/or pre-heats the mold 210 prior to positioning the molten material 220 in the mold 210 (step 130). In another embodiment, the casting furnace 200 receives and/ or pre-heats a plurality of molds 210. In a further embodiment, gaps are formed between the plurality of molds 210 within the casting furnace 200. To facilitate increased control of temperatures within the plurality of molds 210, positioning of the molds 210 includes, but is not limited to, vertical indexing, calculated guiding, thermally semi-insulating the gaps, or a combination thereof. The molten material 220 is then introduced into the mold 210 through an aperture 206 in the casting furnace 200. The aperture 206 includes any suitable aperture, such as, but not limited to, a hole in an upper end 202 of the furnace 200, a pipe, a funnel, or a combination thereof.

The mold 210 includes any suitable mold for receiving the molten material 220 and forming the cast article 300. For example, in one embodiment, the mold 210 includes a ceramic investment shell mold having a pour cup in communication with one or more cavities corresponding to a shape of the cast article 300. The molten material 220 includes any material suitable for casting, and is selected based upon the cast article 300 to be formed. For example, the molten material 220 for forming a turbine bucket includes any material capable of directional solidification and/or single crystal formation. Suitable materials include, but are not limited to, metals, superalloys (for example, nickel, cobalt, or iron base superalloys), or a combination thereof. In another example, the molten material 220 has a composition, by weight, of about 9.8% Cr, about 7.5% Co, about 1.5% Mo, about 6% W, about 4.8% Ta, about 0.5% Nb, about 4.2% Al, about 3.6% Ti, about 0.08% C, about 0.01% B, about 0.1% Hf, and a balance of Ni.

Referring to FIG. 3, the partially withdrawing (step 140) of the mold 210 the withdrawal distance 217 exposes the molten material 220 in the partially withdrawn portion 213 to reduced temperatures outside of the casting furnace 200. The reduced temperatures outside the casting furnace 200 cool the molten material 220 within the partially withdrawn portion 213. Cooling the molten material 220 at least partially solidifies the molten material 220 to form the solidified portion 215 within the partially withdrawn portion 213. The solidification shrinks the molten material 220, increasing a density of the solidified material and forming the freckle grains 214 within the solidified portion 215. As solidification continues, interdendritic fluid flow forms the freckle grains 214. Various characteristics, such as, but not limited to, size and/or shape of the mold 210 facilitate increases or decreases in the occurrence of freckle grains 214 in the solidified portion 215.

In one embodiment, the withdrawal distance 217 is selected to correspond with at least one area of the cast article 300 that includes increased freckle grain forming characteristics, such as, but not limited to, initially withdrawn sections, sections including increased thickness, uninterrupted sections, or a combination thereof. For example, in another embodiment, the withdrawal distance 217 corresponds to a bucket tip shroud of the turbine bucket. The withdrawal distance 217 includes, but is not limited to, between about 0.250 inches (about 0.635 cm) and about 6 inches (about 15.24 cm), between about 0.250 inches (about 0.635 cm) and about 3 inches (about 7.62 cm), between about 0.250 inches (about 0.635 cm) and about 1 inch (about 2.54 cm), between about 0.250 inches (about 0.635 cm) and about 0.750 inches (about 1.910 cm), between about 0.250 inches (about 0.635 cm) and about 0.500 inches (about 1.270 cm), or any combination, sub-combination, range, or sub-range thereof. After the withdrawal distance 217 is reached, the partially withdrawn portion 213 is reinserted (step 150) into the casting furnace 200.

The reinserting (step 150) of the partially withdrawn portion 213 at least partially re-melts the solidified material formed in the solidified portion 215 to reduce or eliminate the freckle grains 214. The molten material 220 which previously had formed the freckle grains 214 solidifies during the completely withdrawing (step 160) of the mold 210 so as to reduce or eliminate the occurrence of freckle grains 214 in the cast article 300. By reducing or eliminating the occurrence of freckle grains 214 during the partially withdrawing (step 140) and the reinserting (step 150), the casting method 100 reduces or eliminates the occurrence of freckle grains 214 without post casting freckle grain treatments, such as, but not limited to, blending away the freckle grains 214.

During the partially withdrawing (step 140), the mold 210 is withdrawn from the casting furnace 200 at a partial withdrawal rate. Suitable partial withdrawal rates include, but are not limited to, between about 1 inch/hour (about 2.54 cm/hour) and about 30 inches/hour (about 76.2 cm/hour), between about 1 inch/hour (about 2.54 cm/hour) and about 15 inches/hour (about 38.1 cm/hour), between about 1 inch/hour (about 2.54 cm/hour) and about 10 inches/hour (about 25.4 cm/hour), between about 1 inch/hour (about 2.54 cm/hour) and about 7 inches/hour (about 17.8 cm/hour), or any combination, sub-combination, range, or sub-range thereof. In another embodiment, the partial withdrawal rate facilitates a type and/or amount of crystallization formed during the solidification of the solidified portion 215. For example, during the partially withdrawing (step 140) of the mold 210, decreasing the partial withdrawal rate increases a duration for exposure of the partially withdrawn portion 213 to the reduced temperature outside of the casting furnace 200. The increased exposure increases the amount of crystallization formed during the solidification of the solidified portion 215.

During the completely withdrawing (step 150), the mold 210 is withdrawn from the casting furnace 200 at a complete withdrawal rate. Suitable complete withdrawal rates include, but are not limited to, between about 1 inch/hour (about 2.54 cm/hour) and about 30 inches/hour (about 76.2 cm/hour), between about 1 inch/hour (about 2.54 cm/hour) and about 15 inches/hour (about 38.1 cm/hour), between about 1 inch/hour (about 2.54 cm/hour) and about 10 inches/hour (about 25.4 cm/hour), between about 1 inch/hour (about 2.54 cm/hour) and about 7 inches/hour (about 17.8 cm/hour), or any combination, sub-combination, range, or sub-range thereof. The complete withdrawal rate facilitates a type and/or rate of crystallization in the cast article 300. For example, during the completely withdrawing (step 160) of the mold 210, the complete withdrawal rate facilitates increased amounts of either directional or single-crystal solidification.

During the reinserting (step 150), at least a portion of the partially withdrawn portion 213 is reinserted into the casting furnace 200 at a reinsertion rate proceeding in a direction opposite or substantially opposite a direction of the partially withdrawing (step 140). In one embodiment, the reinsertion rate is equivalent to any of the suitable partial or complete withdrawal rates disclosed herein. In another embodiment, the rate of reinsertion is less than the suitable partial or complete withdrawal rates disclosed herein. In yet another embodiment, the rate of reinsertion is greater than the suitable partial or complete withdrawal rates disclosed herein. For example, suitable reinsertion rates include, but are not limited to, between about 1 inch/hour (about 2.54 cm/hour) and about 30 inches/hour (about 76.2 cm/hour), between about 1 inch/hour (about 2.54 cm/hour) and about 15 inches/hour (about 38.1 cm/hour), between about 1 inch/hour (about 2.54 cm/hour) and about 10 inches/hour (about 25.4 cm/hour), between about 1 inch/hour (about 2.54 cm/hour) and about 7 inches/hour (about 17.8 cm/hour), or any combination, sub-combination, range, or sub-range thereof.

Additionally, in one embodiment, the partial withdrawal rate, the complete withdrawal rate, and/or the reinsertion rate are automated by any suitable technique throughout the casting method 100. Suitable techniques of the automation include, but are not limited to, providing transitions between the partially withdrawing (step 140), the reinserting (step 150), and/or the completely withdrawing (step 160), automatically reversing the partially withdrawing (step 140) to provide the reinserting (step 150), automatically reversing the reinserting (step 150) to provide the completely withdrawing (step 160), varying the partial withdrawal rate, the reinsertion rate, and/or the complete withdrawal rate, adjusting for variations in temperature within the casting furnace 200, adjusting for the area of the cast article 300 that includes increased freckle grain 214 forming characteristics, or a combination thereof.

In one embodiment, the partial withdrawal rate, the reinsertion rate, and/or the complete withdrawal rate, are maintained throughout each step (with the exception of an acceleration to begin each step and a deceleration to end each step). For example, the partial withdrawal rate, the reinsertion rate, and the complete withdrawal rate are about 5 inches/hour (about 12.7 cm). In another embodiment, at least one of the partial withdrawal rate, the reinsertion rate, and the complete withdrawal rate is varied throughout the casting method 100. Varying throughout the casting method 100 includes, but is not limited to, between steps (for example, between the partially withdrawing (step 140), the reinserting (step 150), and/or the completely withdrawing (step 160)), during at least one step, corresponding to the area of the cast article 300 that includes increased freckle grain 214 forming characteristics, or a combination thereof. For example, in one embodiment, the partial withdrawal rate and the complete withdrawal rate are about 3 inches/hour (about 7.6 cm/hour), while the reinsertion rate is about 10 inches/hour (about 25.4 cm/hour).

Figure 4:
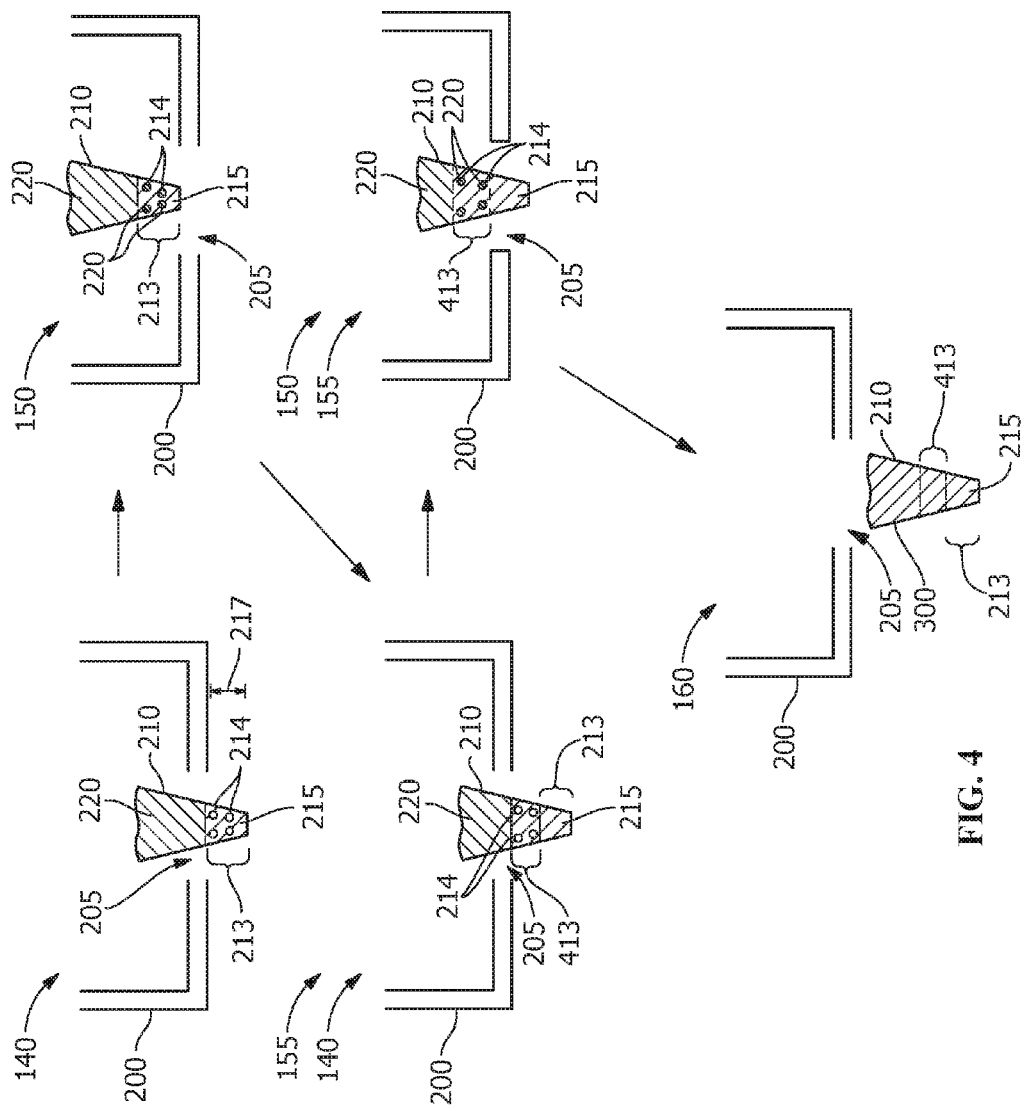
FIG. 4 shows an enhanced view of a casting method including multiple reinsertions according to an embodiment of the disclosure.

Referring to FIG. 4, in another embodiment, the casting method 100 includes repeating (step 155) of the partially withdrawing (step 140) and/or the reinserting (step 150) of the mold 210. In one embodiment, during the repeating (step 155), the partially withdrawing (step 140) exposes a previously-unexposed portion 413, and the reinserting (step 150) at least partially re-melts the solidified portion 215 within a reinsertion segment of the previously-unexposed portion 413. The reinsertion segment includes, but is not limited to, all, or substantially all, of the previously-unexposed portion 413, less than the entire previously-unexposed portion 413, the area of the cast article 300 that includes increased freckle grain 214 forming characteristics, or a combination thereof. For example, in another embodiment, during the repeating (step 155), the partially withdrawing (step 140) exposes the previously-unexposed portion 413 of about 1 inch (about 2.54 cm), including the reinsertion segment of about 0.5 inches (about 1.27 cm) corresponding to an area of increased thickness. The re-melting of solidified portion 215 within the reinsertion segment reduces or eliminates the freckle grains 214 formed therein.

In another example, the partially withdrawing (step 140) exposes the partially withdrawn portion 213 of about 0.5 inches (about 1.27 cm), and the reinserting (step 150) partially re-melts the solidified portion 215 within the partially withdrawn portion 213. Next, the repeating (step 155) of the partially withdrawing (step 140) exposes the partially withdrawn portion 213 of about 0.5 inches (about 1.27 cm), including the solidified portion 215 that has been partially re-melted, as well as the previously-unexposed portion 413 of about 0.5 inches (about 1.27 cm). The repeating (step 155) of the reinserting (step 150) then re-melts the solidified portion 215 formed within the previously-unexposed portion 413 without re-melting the solidified portion 215 within the partially withdrawn portion 213 that has been partially re-melted.

In one embodiment, the casting method 100 includes partially withdrawing (step 140) the mold 210 with the molten material 220 for a withdrawal time. The withdrawal time includes any suitable amount of time corresponding to formation of the solidified portion 215. Suitable amounts of time include, but are not limited to, up to about 2 hours, up to about 1.5 hours, up to about 1 hour, between about 1 hour and about 2 hours, up to about 0.5 hours, or any combination, sub-combination, range, or sub-range thereof. The partial withdrawal rate during the withdrawal time includes any suitable partial withdrawal rate disclosed herein. In a further embodiment, the partial withdrawal rate during the withdrawal time includes, but is not limited to, a constant rate, a pre-set variation in the rate of withdrawal, a progressive rate, or a combination thereof.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A casting method in a casting furnace, the casting furnace comprising a withdrawal region in a lower end, the method comprising:
- positioning a mold within the casting furnace;
- positioning a molten material in the mold;
- partially withdrawing the mold a withdrawal distance through the withdrawal region in the casting furnace, the withdrawal distance providing a partially withdrawn portion, at least partially solidifying the partially withdrawn portion; then
- reinserting at least a portion of the partially withdrawn portion into the casting furnace through the withdrawal region, at least partially re-melting the partially withdrawn portion; and then
- completely withdrawing the mold from the casting furnace through the withdrawal region to produce a directionally solidified or single crystal cast article;
- wherein at least partially re-melting the partially withdrawn portion reduces or eliminates freckle grains from the partially withdrawn portion.

2. The casting method of claim 1, comprising varying a partial withdrawal rate during the partially withdrawing of the mold, the varying corresponding to portions of the mold including increased freckle grain forming characteristics.

3. The casting method of claim 1, comprising varying a complete withdrawal rate during the completely withdrawing of the mold, the varying corresponding to portions of the mold including increased freckle grain forming characteristics.

4. The casting method of claim 1, comprising decreasing at least one of a partial withdrawal rate and a complete withdrawal rate corresponding to a portion of the mold including increased thickness.

5. The casting method of claim 1, wherein the partially withdrawing of the mold comprises a partial withdrawal rate of between about 1 inch per hour and about 10 inches per hour, the completely withdrawing of the mold comprises a complete withdrawal rate of between about 1 inch per hour and about 10 inches per hour, and the reinserting comprises a reinsertion rate of between about 1 inch per hour and about 20 inches per hour.

6. The casting method of claim 5, wherein the partial withdrawal rate differs from the complete withdrawal rate.

7. The casting method of claim 5, wherein the reinsertion rate is greater than the partial withdrawal rate and the complete withdrawal rate.

8. The casting method of claim 5, wherein the reinsertion rate, the partial withdrawal rate, and the complete withdrawal rate are equivalent.

9. The casting method of claim 1, further comprising a partial withdrawal hold time prior to the reinserting, and a reinsertion hold time prior to the completely withdrawing.

10. The casting method of claim 1, further comprising positioning one or more additional molds within the casting furnace.

11. The casting method of claim 10, wherein the positioning of the one or more additional molds is selected from the group consisting of vertical indexing, calculated guiding, thermally semi-insulating gaps formed between the one or more additional molds, and combinations thereof.

12. The casting method of claim 1, wherein the withdrawal distance is between about 0.250 inches and about 6.0 inches.

13. The casting method of claim 1, further comprising repeating the partially withdrawing and the reinserting of the mold prior to the completely withdrawing.

14. The casting method of claim 13, wherein the repeating of the partially withdrawing exposes a previously-unexposed portion of the mold, and the repeating of the reinserting partially re-melts the solidified portion in the previously-unexposed portion of the mold.

15. The casting method of claim 1, wherein at least partially re-melting the partially withdrawn portion eliminates freckle grains from the cast article.

16. The casting method of claim 1, wherein the partially withdrawn portion comprises a turbine bucket tip shroud, and the cast article comprises a turbine bucket.

17. A casting method in a casting furnace, the casting furnace comprising a withdrawal region in a lower end, the method comprising:
- positioning a mold within the casting furnace;
- positioning a molten material in the mold;
- partially withdrawing the mold through the withdrawal region in the casting furnace for a withdrawal time to provide a partially withdrawn portion, at least partially solidifying the partially withdrawn portion;
- reinserting at least a portion of the partially withdrawn portion into the casting furnace through the withdrawal region, at least partially re-melting the partially withdrawn portion; and then
- completely withdrawing the mold from the casting furnace through the withdrawal region to produce a directionally solidified or single crystal cast article;
- wherein at least partially re-melting the partially withdrawn portion reduces or eliminates freckle grains from the partially withdrawn portion.

* * * * *